United States Patent [19]
Johnson et al.

[11] Patent Number: 5,546,804
[45] Date of Patent: Aug. 20, 1996

[54] TRANSMITTER WITH MOISTURE DRAINING HOUSING AND IMPROVED METHOD OF MOUNTING RFI FILTERS

[75] Inventors: John D. Johnson, St. Paul; William R. Kirkpatrick, Faribault, both of Minn.

[73] Assignee: Rosemount Inc., Eden Prairie, Minn.

[21] Appl. No.: 288,949

[22] Filed: Aug. 11, 1994

[51] Int. Cl.$^6$ .................................................. G01D 11/30
[52] U.S. Cl. ............................ 73/431; 73/866.5; 191/26; 312/229
[58] Field of Search ................................. 73/866.5, 431; 191/26; 312/229

[56] References Cited

U.S. PATENT DOCUMENTS

| 691,495 | 1/1902 | Seguy | 191/26 |
|---|---|---|---|
| 2,935,366 | 5/1960 | Cahn | 312/229 |
| 4,120,547 | 10/1978 | Price et al. | 312/229 |
| 4,569,228 | 2/1986 | Bellgardt et al. | 73/866.5 |
| 4,703,664 | 11/1987 | Kirkpatrick et al. | 73/866.5 |
| 4,872,356 | 10/1989 | Barnett et al. | 73/866.5 |
| 4,899,586 | 2/1990 | Koneval et al. | 73/866.5 |
| 5,023,577 | 6/1991 | Drake | 333/182 |
| 5,069,072 | 12/1991 | Taylor et al. | 73/866.5 |
| 5,159,155 | 10/1992 | Nishihara | 174/50 |
| 5,199,308 | 4/1993 | Lawhon et al. | 73/866.5 |

FOREIGN PATENT DOCUMENTS 2486649  1/1982  France.

OTHER PUBLICATIONS

Product Manual: "Model 2088 Absolute or Gage Pressure Transmitter," Rosemount Inc., Eden Prairie, MN, Jan. 1993.
Appendix A: Photographic views of Rosemount Model No. 3044 transmitter showing conduit configuration.
Appendix B: Photographic views of Rosemount Model No. 2088 transmitter showing terminal block electronics and RFI filters.
Appendix C: Photographic Views of Rosemount Model No. 2024 transmitter substantially as shown in Figure 1 of the pending application.

Primary Examiner—Richard Chilcot
Assistant Examiner—George M. Dombroske
Attorney, Agent, or Firm—Westman, Champlin & Kelly, P.A.

[57] ABSTRACT

A transmitter transmitting a sensed process variable over a conductor includes a cylindrical housing having a terminal compartment and an electronics compartment separated by a bulkhead. The terminal compartment used for conductor connection is subject to moisture accumulation. An access channel fully intersects an internal surface of terminal compartment such that the access channel drains moisture from the terminal compartment across a range of mounting orientations. The transmitter includes a circuit in the electronics compartment for compensating a process variable and providing the compensated process variable via a feedthrough circuit assembly in the bulkhead, which in one embodiment, includes an encapsulated radio frequency interference filter, to terminals in the terminal compartment for coupling to a conductor that is connected to an external controller.

17 Claims, 5 Drawing Sheets

5,546,804

TRANSMITTER WITH MOISTURE DRAINING HOUSING AND IMPROVED METHOD OF MOUNTING RFI FILTERS

FIELD OF THE INVENTION

The present invention relates to transmitters used in industrial process control systems. In particular, the present invention relates to a process variable transmitter suitable for high humidity or wet environmental operational conditions.

BACKGROUND OF THE INVENTION

Transmitters sense process variables in a variety of applications such as oil and gas refineries, chemical storage tank farms, or chemical processing plants. A process variable (PV) is a sensed parameter of a process or sensed property of a product, including absolute pressure, differential pressure, temperature, flow, material level, etc. One common transmitter application uses a transmitter to sense a PV representative of a process and transmits the sensed PV to a controller over cabling. For a two wire transmitter, the cabling is a twisted two wire cable set. The transmitter and controller are electrically cabled in series forming a current loop. The transmitter receives no external power and derives all its operating power from the current loop. Typically, the transmitter regulates the magnitude of current in the current loop, as a function of the sensed PV. In one standard protocol, the current ranges between 4 and 20 mA. Three and four wire transmitters use other cabling as appropriate.

Transmitters commonly have a cylindrically shaped housing with a bulkhead separating the housing into two compartments, with each compartment capped by a threaded cover. A cylinder as used in this specification is defined a solid bounded by a given curved surface and two parallel planes. An electronics compartment houses electronics for sensing and compensating the PV, and a terminal compartment houses terminals to connect the compensated PV to the cabling. The bulkhead has an electronics feedthrough between the compartments. The terminal compartment includes an externally threaded access channel through which the cabling enters the transmitter housing to connect to the transmitter. Many transmitter housings have two threaded access channels in the terminal compartment for connecting to external hollow electrical conduit. The hollow conduit forms a passageway between the controller and the transmitter which protects the cabling inside. The cabling typically contains two conductors for a two wire transmitter. The location of the access channels varies on transmitter housings, ranging from the top to the bottom of the housing. For temperature transmitters, the top is that side of the transmitter housing opposite the mounting boss. For pressure and other types of transmitters, the top is that side of the transmitter housing opposite the process sensor location.

Although transmitters are commonly used in various rugged industrial applications, problems have arisen when a transmitter is installed in a humid or high moisture operating environment. With the exception of hermetically sealed transmitters, moisture accumulation in the terminal compartment is a common problem encountered by transmitter designs. Hermetically sealed transmitters are costly and difficult to configure or repair as the hermetic seal is typically welded shut. In non-hermetically sealed transmitter, moisture condenses within the housing, sometimes filling the housing if not drained periodically. This moisture accumulation causes electrical shorting between terminals in the terminal compartment, cross talk or growth of organic or dendritic metallic matter which degrade the transmitter's performance. A dendritic growth is caused by a metallic filament formed from metal ions transported by a liquid on an insulating surface, the filament growing under the influence of a DC voltage bias. If the filament bridges across conductors, it can create low impedance leakage paths. A related problem to the condensate accumulation is intrusion of moisture into the transmitter. An unsealed or even an improperly hermetically sealed transmitter accumulates moisture inside if subjected to directed moisture such as pressure washing or driving rain. The detrimental effects of accumulated moisture are the same as condensate accumulation. In PRIOR ART FIG. 1, a transmitter shown generally at 50, has a terminal compartment 52 from which it is difficult to drain accumulated moisture. A pair of access channel openings 54 are located at a top 56 of transmitter 50 such that any moisture entering through the access channels 54 falls to the bottom of terminal compartment 52 and is trapped. Even if transmitter 50 is rotated and mounted 90° in orientation, terminal compartment 52 remains partially filled to a waterline 58 as access channels 54 do not fully drain trapped moisture. Wall structure 60 within the transmitter housing juts out from the inner surfaces of compartment 52 so that even when transmitter 50 is mounted sideways, moisture must accumulate to the level of waterline 58 before draining.

Moisture can also degrade the effectiveness of a radio frequency interference (RFI) filter or feedthroughs in a transmitter. To minimize the effects of an electrically noisy process environment, PV electronics are commonly shielded in a Faraday cage formed in the transmitter by the electronics compartment, an access cover and RFI filters on electrical signal connections. If any one element of Faraday cage is compromised, the desired isolation is rendered ineffective and degrades transmitter performance. RFI filters typically include a mechanical case having a threaded exterior for screwing the RFI filter into the bulkhead. Moisture becomes a problem for the RFI filter when moisture accumulates across the conductor and the RFI filter case. A low impedance leakage path may be created between the case of the RFI filter and the conductor, thereby compromising the electrical isolation of the conductor. Another problem for the RFI filter arises in keeping the bulkhead watertight. The RFI filter screws into the bulkhead with conductors exposed on each side of the bulkhead, creating a seal. However, the sealing insertion force or torque required to screw in the threaded RFI filters undesirably stresses the RFI filters. A stressed RFI filter may sometimes degrade the transmitter performance by not providing the desired electrical isolation, and if detected during assembly can require substantial rework in the manufacturing process.

Therefore, a transmitter is desired which promotes the draining of accumulated moisture from within the transmitter. Another characteristic desired of the transmitter is a reliable feedthrough circuit that is assembled in a manner that does not stress the components during assembly.

SUMMARY OF THE INVENTION

A transmitter transmitting a sensed process variable over a conductor includes a cylindrical housing having a terminal compartment and an electronics compartment separated by a bulkhead. The terminal compartment used for conductor connection is subject to moisture accumulation. An access channel fully intersects an internal surface of the terminal compartment such that the access channel drains moisture from the terminal compartment across a range of mounting orientations. The transmitter includes a circuit in the electronics compartment for compensating a terminal variable and providing the compensated process variable via a feedthrough terminal in the bulkhead, which in one embodiment, includes an encapsulated radio frequency interference filter, to process terminals in terminal compartment for coupling to a conductor that is connected to an external controller.

DETAILED DESCRIPTION OF THE PREFERRED EMBODIMENTS

Figure 2:
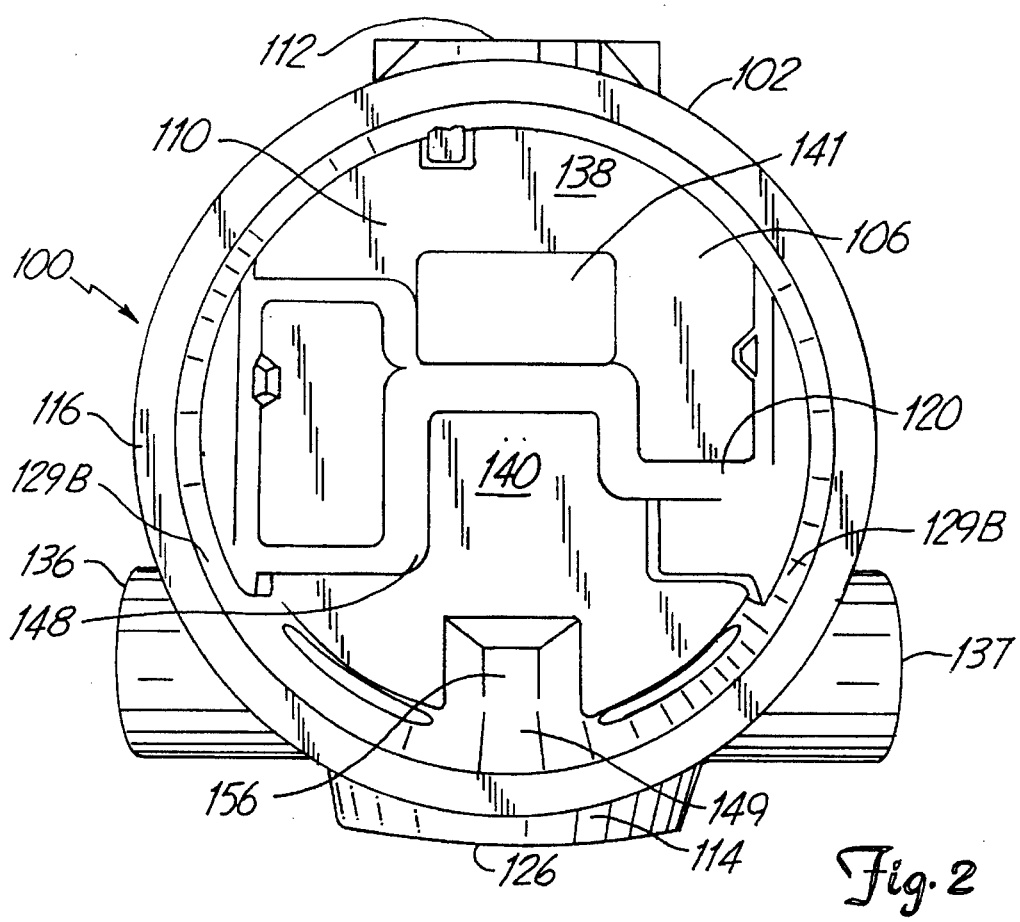
FIG. 2 is an end view of a transmitter of the present invention, showing a terminal compartment.
Figure 3:
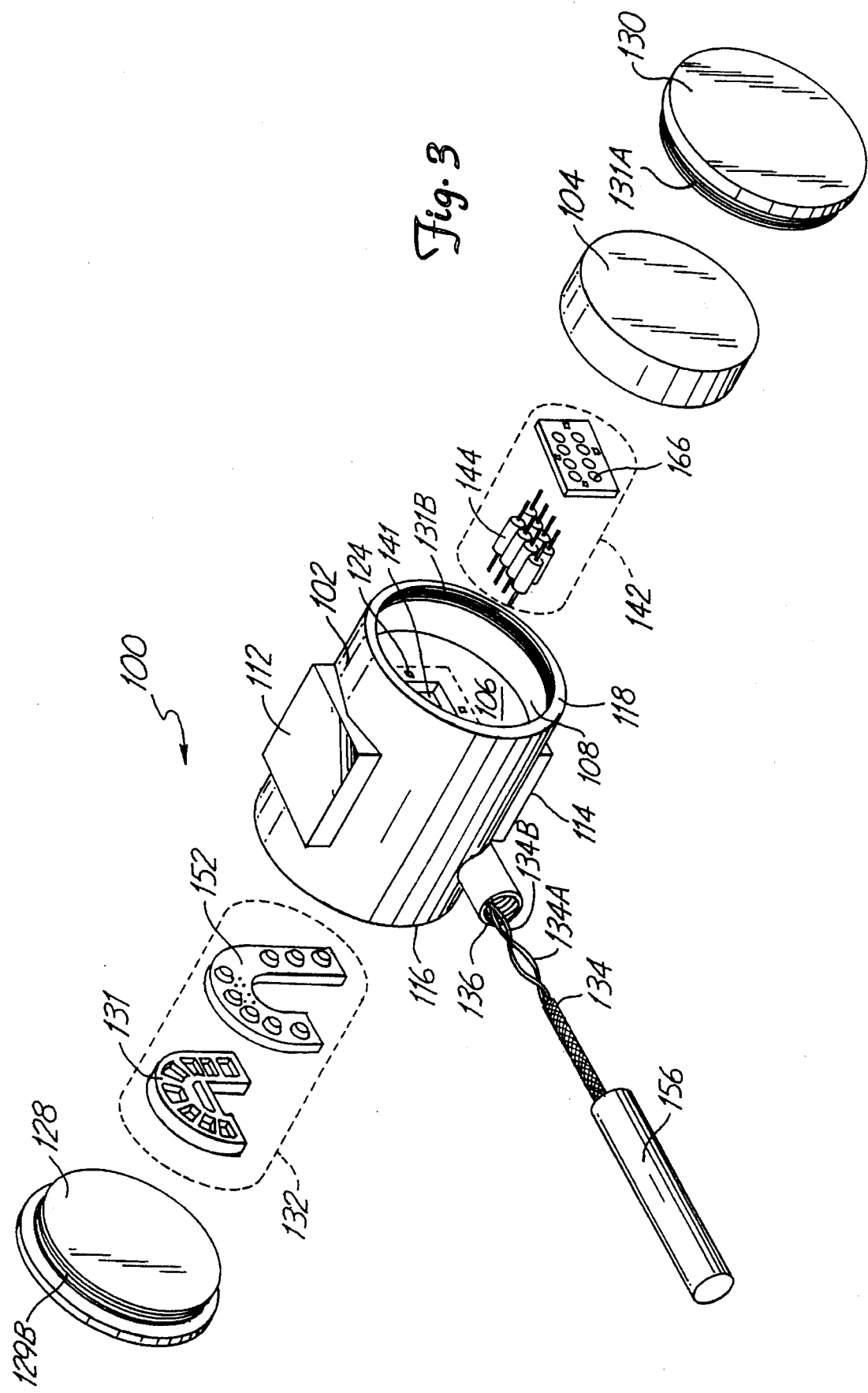
FIG. 3 is a exploded sectional perspective view of the transmitter of the present invention.
Figure 4A:
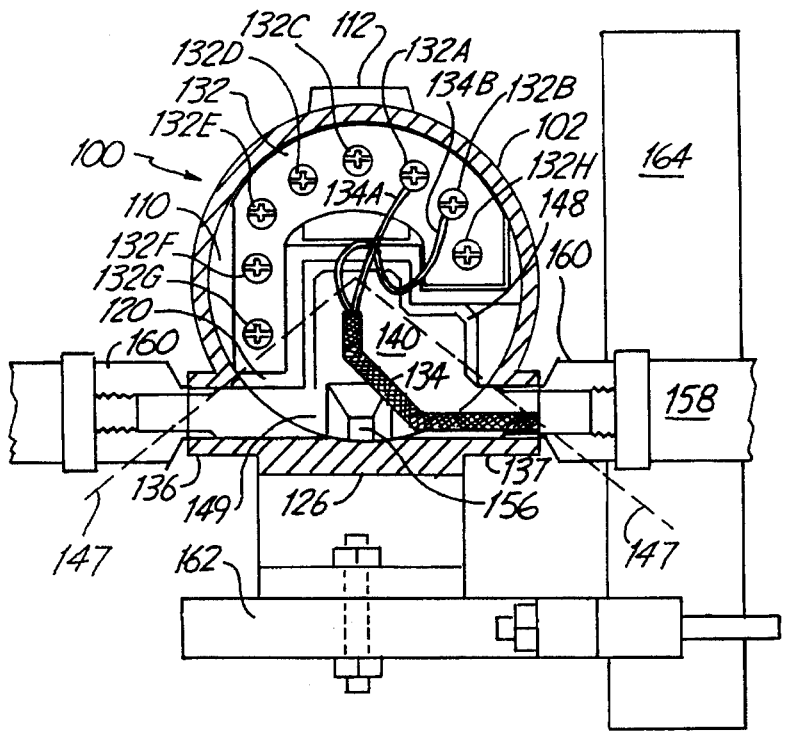
FIGS. 4A and 4B are cutaway views of an upright and a side mounting orientation of the present invention, showing moisture draining potential and cabling interface in the terminal compartment.

In FIGS. 2 and 3, a transmitter 100 includes a housing 102. Housing 102 has two compartments separated by a bulkhead 106; an electronics compartment 108 and a terminal compartment 110. Housing 102 has a top 112, a base 114, a threaded terminal end 116 and a threaded electronics end 118. Base 114 of housing 102 has a suitable mounting boss area 126 machined into housing 102. Housing 102 is cylindrical in shape with the central axis of the cylinder shape running from the center points of round electronics end 118 and round terminal end 116. The terminal compartment 110 is formed by capping terminal end 116 with a cover 128. The electronics compartment 108 is formed by capping electronics end 118 with a cover 130. Terminal compartment 110 and electronics compartment 108 share bulkhead 106 that forms the back of each compartment 108,110. The surface of bulkhead 106 in terminal compartment has a retaining wall 120 formed on it; retaining wall 120 integrally attaches to the internal surface of the terminal compartment 110. The surface of bulkhead 106 in electronics compartment 108 has a feedthrough mounting boss 124 disposed on it. A feedthrough circuit opening 141 is formed through bulkhead 106 to facilitate communication of electrical signals between compartments 108,110. Housing 102 is preferably formed by a die or impression casting method and then machined to bring mounting bosses 126,124 and component areas 108, 110 into a desired tolerance and smooth finish. Covers 128,130 preferably includes a male thread set 129A,131A and a matching female thread set 129B, 131B contained in an inner rim of compartments 108, 110. The particular thread interface of covers 128,130 provides a stronger barrier to flame pathways than another thread interface. In the unlikely event of an explosion with in transmitter, the overpressure forces the threads 129A–B,131A–B into each other rather than being forced apart. In FIGS. 4A–B, terminal compartment 110 includes a terminal block assembly 132 for connecting a cable 134 containing a pair of conductors 134A–B to a controller (not shown). Integral retaining wall 120 divides terminal compartment 110 into a component mounting area 138 and a watershed area 140. A pair of access channels 136,137 enter housing 102 through the wall of terminal compartment 110 at base 114 of transmitter 100. At the time of installation, conduit 158 is threaded into one of access channels 136,137 through an NPT connector 160 or the like and conductors 134A–B are individually connected to terminals 132A–B on terminal block assembly 132. Watershed area 140, which is the area below retaining wall 120, includes the internal openings of access channels 136,137 and a cable guide 156.

In FIG. 3, electronics compartment 108 includes a process variable (PV) electronics 104 of a suitable design. Electronics 104 receive a sensed temperature signal from a temperature sensor (not shown). Electronics 104 compensate the sensed temperature signal for known repeatable errors and output a current signal representative of the sensed temperature to terminal block 132. Electronics 104 and conductors 134A–B, attached to terminal block 132 are electrically connected through bulkhead 106 by a feedthrough circuit assembly 142 which includes eight RFI filters 144 and a mounting plate 166. All electrical signals connected to electronics 104 pass through signal pins on RFI filters 144. Electronics compartment 108 is protected from the environment by access cover 130. The feedthrough circuit assembly 142 and the feedthrough circuit opening 141 are filled or potted with an encapsulant 154 that seals the bulkhead 106 and electronics compartment 110. Transmitter 100 can be configured to provide an output representative of other sensed process variables such as absolute temperature, differential temperature, differential pressure, absolute or gauge pressure, flow, pH or others, when used with appropriate electronics 104.

In FIGS. 4A–B, a pair of standard mounting arrangements are shown with transmitter 100 being mounted to a bracket 162 which attaches to mounting boss 126. Bracket 162 is attached to a post 164 or the like. In either mounting orientation, one of the access channels 136,137 is connected to conduit 158 and acts as a drain. In an upright mounting orientation, as shown in FIG. 4A, either access channel 136 or 137 functions equally well as the drain. As transmitter 100 is mounted in a clockwise (or counterclockwise) direction from upright, the lower one of access channels 136,137 is the drain. FIGS. 4A–B both show a lowest point 149, which is the point to which moisture drains within transmitter 100 before exiting compartment 110. Lowest point 149 changes location as transmitter 100 is mounted in various mounting orientations.

The draining structure of compartment 110 includes retaining wall 120, watershed area 140 and access channels 136,137. All internal surfaces of the compartment 110 are smoothed to provide a continuous cast surface to concentrate moisture into watershed area 140. All joining surfaces within compartment 110 are filleted for the same purpose. Smooth surfaces and filleted joints limit the available area for droplets to attach, and with the force of gravity, urge formed droplets towards watershed area 140.

Figure 1:
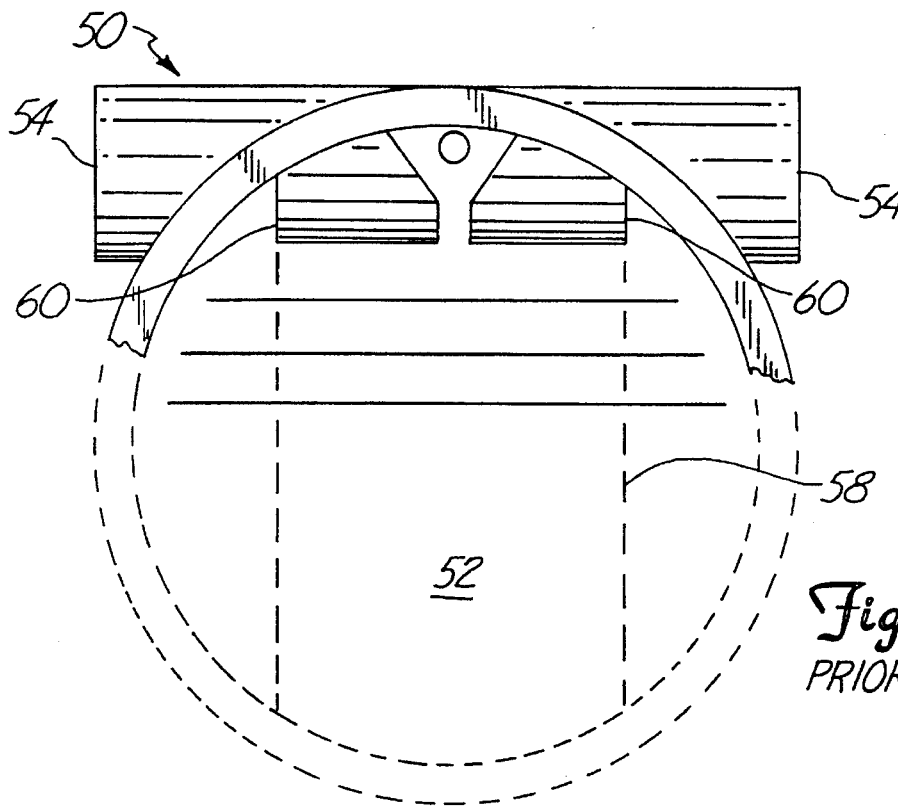
FIG. 1 is a view of a terminal compartment of a prior art transmitter.

The intersections of access channels 136,137 with the inner surface of terminal compartment 110 are flush with the inner surfaces of compartment 110. No other structure inside compartment 110, such as that shown at 60 in PRIOR ART FIG. 1, obstructs moisture from draining out channels 136, 137. Preferably, those sections of channels 136,137 which extend outside housing 102 are declined downward to facilitate enhanced drainage. In FIG. 4A, transmitter 100 fully drains moisture within a 120 degree mounting range (i.e. 60 degrees offset in either direction from upright), as indicated by dashed line 147. In the same drawing, transmitter 100 allows a small amount of moisture to accumulate in compartment 110, but not enough to contact electronics or terminals, when mounted over a full 180 degrees.

Figure 4C:
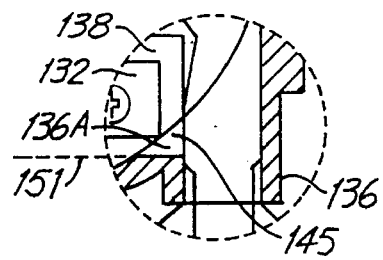
FIG. 4C is a detailed view of the transmitter of FIG. 4B, showing another embodiment having enhanced draining potential.
Figure 4B:
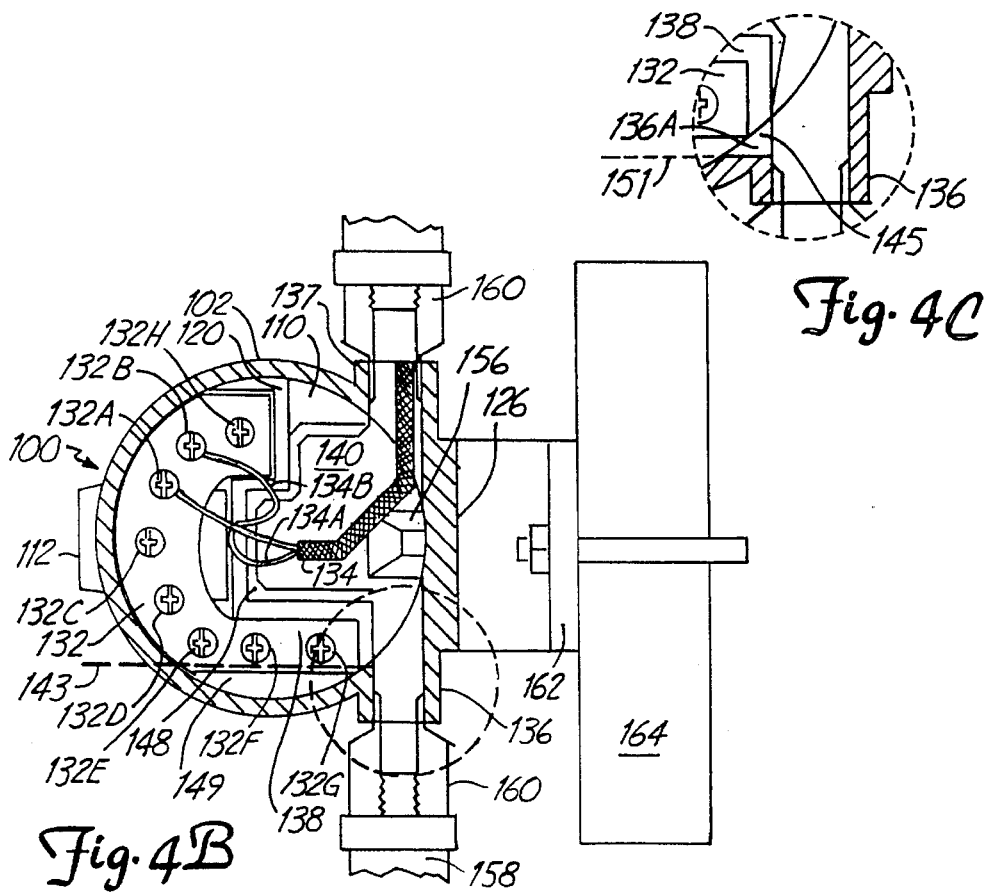
Figure 5:
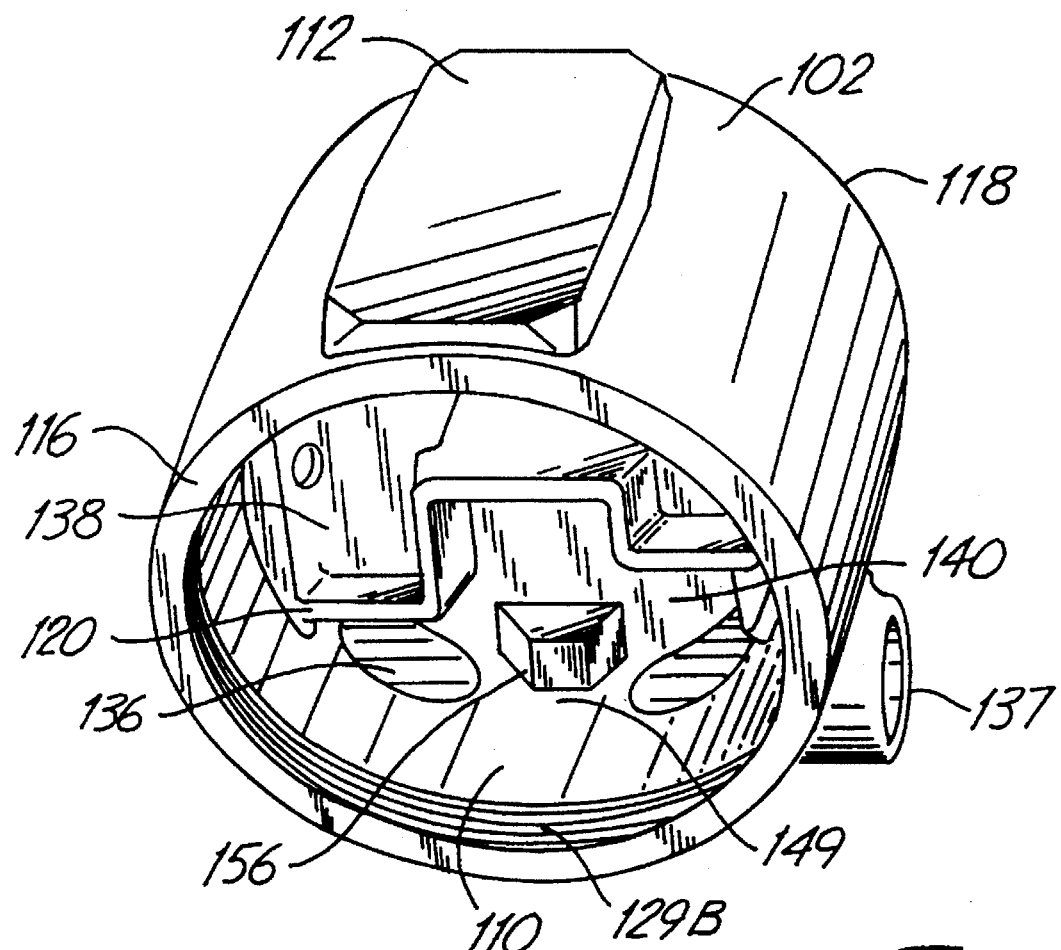
FIG. 5 is a perspective view of the transmitter shown in FIG. 4A.

A preferred embodiment of the present invention is shown in FIG. 4C, which enlarges the area in FIG. 4B around the intersection of access channels 136,137 with the inner surface of compartment 110. Specifically, the corners in the space indicated at 145 in FIG. 4C have been leveled and flared out, and the resulting surface smoothed to allow drainage over a full 180 degrees of mounting orientations (i.e. 90 degrees offset in either direction from upright). The upper section of the internal intersection of access channels 136,137 with the internal wall of compartment 110 has been flared to lower the level of waterline 143 (shown in FIG. 4B) to the level of waterline 151. Terminal block 132 and conductors 132A–G are permanently above water line 151 and cannot be wetted by accumulated moisture. All electrical connections between terminal block 132 and conductors 134A–B are made above the access channels 136,137, keeping the electrical connections dry. Flared areas 136A and 137A (not shown) are formed during casting or machined thereafter, but are formed in the existing wall structure without adding material to housing 102. Flared areas 136A,137A may be narrow channels formed in the internal wall of compartment 110 and extending from access channels 136,137 to lowest point 149, or widened drainage flowages as shown in FIG. 4C. In all cases, flared areas 136A,137A are blended into the internal surface of watershed area 140 to reduce sharp edges and facilitate moisture drainage.

Cable guide 156 deflects inserted twisted pair conductors 134A–B towards terminal block assembly 132. The redirection of cabling 134 facilitates the distribution of conductors 134A–B and prevents the conductors from entangling. Access channels 136,137 are preferably located opposing each other, on the base 114 of terminal compartment 110 to allow one cable guide 156 to direct cabling for both channels 136,137. Cable guide 156 is cast or mounted on the inner surface of compartment 110 between access channels 136, 137 and is beveled to allow moisture flow off cable guide 156 into access channels 136,137. Conductors 134A–B are splayed out to separate connections on terminal block 132. Conductors 134A–B are typically the same length, and each conductor will have excess length in all but the longest connection path to terminal block 132. A terminal block bezel 131 is made of a non-conductive plastic and has a horseshoe curved shape to allow conductors to be centrally distributed. The excess lengths of conductors 134A–B are stored within compartment 110. Removing non-essential structure in watershed area 140 and the shape of terminal block assembly 132 allows more room in compartment 110 to store excess lengths of conductors, thereby obviating shorting caused by pinched conductors when the cover is installed.

Figure 6:
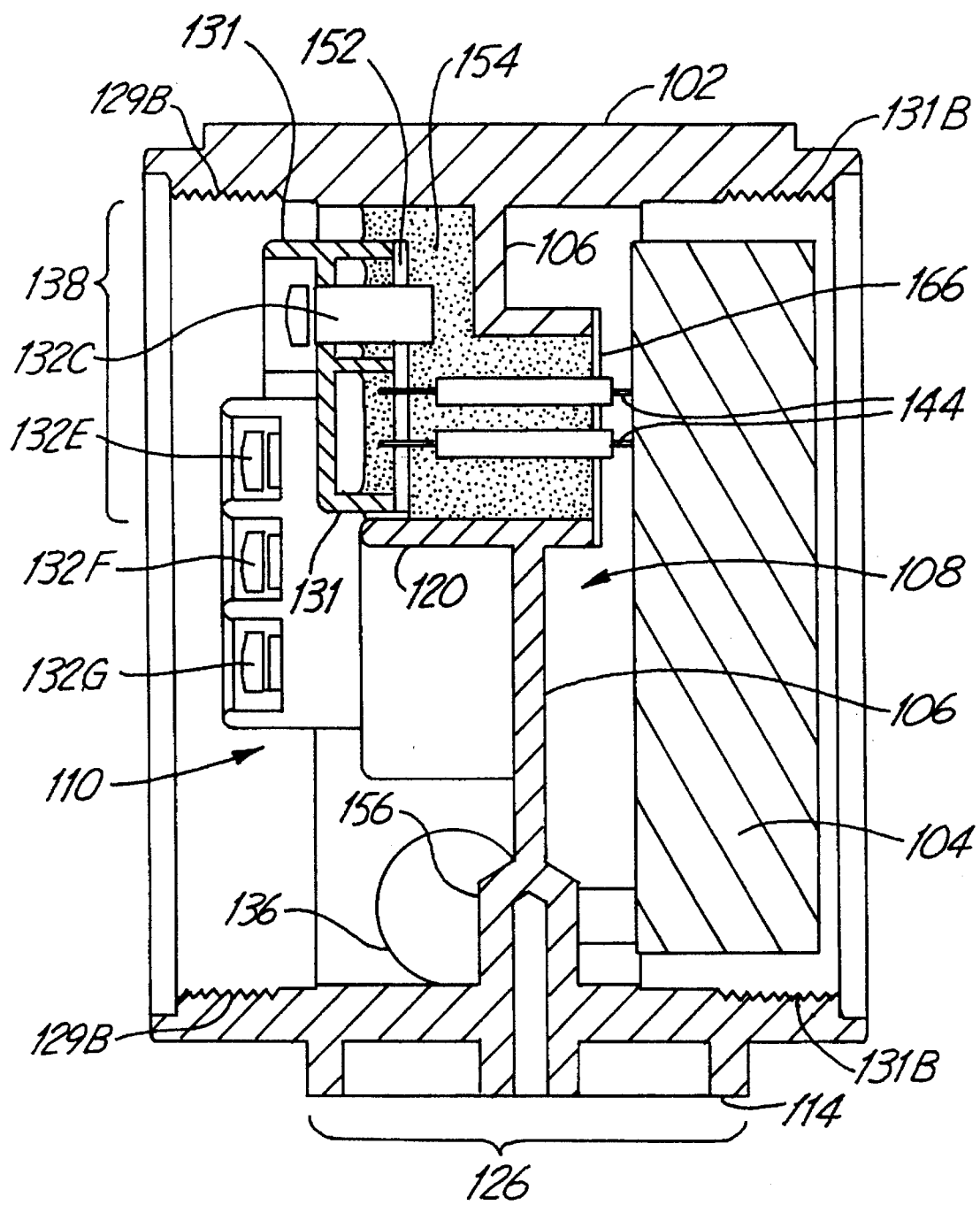
FIG. 6 is a sectional cutaway of the transmitter of the present invention showing a feedthrough circuit in place.

In FIGS. 3 and 6, an interface circuit card 152 mounts into component mounting area 138 in compartment 108, and then plastic bezel 131 is placed over card 152 with screw terminals 132 protruding through bezel 131. Bezel 131 insulates and spaces terminals 132 and also protects electrical components on interface circuit card 152. The case of each of the eight RFI filters 144 is soldered into a conductive mounting plate 166, so as to make a completed feedthrough circuit assembly 142. Assembly 142 is inserted through opening 141 in bulkhead 106 and mounted with metal screws to an integral mounting boss 124. Mounting plate 166 also positions RFI filters 144 for encapsulation. The screws which mount assembly 142 to bulkhead 106 electrically ground the case of filters 144 to housing 102. Interface circuit card 152 provides mechanical mounts for screw terminals 132 and electrically connects signal pins on filters 144, some of which represent the compensated process variable, to the screw terminals.

An encapsulant 154 is introduced around circuit assembly 142, on the terminal compartment 110 side of bulkhead 106, so as to completely seal one compartment from the other. Encapsulant 154 is preferably an epoxy potting compound, but may also be made of any curable potting compound. Component mounting area 138 is filled with enough encapsulant 154 to rise to the level of the height of retaining wall 120. Once filled, there are no recesses or hollows within component mounting area 138 where moisture can collect and which contribute to electrical leakage. Any moisture which may form within area 138 is urged, with the force of gravity, toward watershed area 140 and out access channels 136,137. Aside from the enhanced draining feature encapsulant provides, encapsulant 154 provides a substantially infinite impedance between the case and the signal pins of the RFI filters, thereby substantially limiting leakage current between signals and electrical ground. The present invention permanently installs RFI filters 144 without a potentially damaging torque action, while augmenting the environmental isolation between compartments and the electrical isolation between signals and ground. Once encapsulant 154 cures, signal pins of filters 144 on the terminal compartment side are connected to signal connection points on electronics 104.

RFI filters 144 are typically composed electrically of the $\pi$, L or C filter types for suppression of high frequency noise. A commercially available RFI filter 144 configuration typically consists of a ceramic capacitor shaped as a hollow cylinder. A conductive material on both the inside and the outside surfaces of the cylinder forms the capacitor. The external surface of the cylinder is grounded to the case. The inside surface of the cylinder is electrically connected to a conductor (i.e. the signal pin), which vans the length of the filter. Other forms of RFI filters 144 may include an inductor/capacitor combinations, a current shunt, a series inductive barrier or other types of electrical noise filtering electronics.

The present invention provides a transmitter design that resists electrical faults due to accumulated moisture by draining away moisture as it accumulates over a broad range of mounting orientations. The transmitter of the present invention drains moisture over a wide range of mounting configurations without additional external hardware or special conduit drains. The placement of the oppositely located access channels 136,137 at the base 114 also orients cabling 134 entering the transmitter 100, facilitating connection of conductors to terminals. Encapsulation 154 provides improved electrical and environmental isolation, while permanently positioning RFI filters 144 and obviating torsional stress during installation. Furthermore, filling component mounting area 138 with encapsulant to a level coincident with the height of retaining wall 120 ensures that moisture is channeled into watershed area 140 and ultimately exits the access channels.

The manner and content of the present invention disclosed herein is described with reference to a preferred embodiment. Workers skilled in the art will recognize that changes may be made in form and detail without departing from the spirit and scope of the invention.

What is claimed is:

1. A transmitter for transmitting a process variable over cabling, comprising:

a cylindrical housing having a process mounting disposed on a base of the housing, the housing having a first and a second compartment sharing an internal bulkhead, the second compartment tending to receive moisture and capped by a cover, the second compartment having a curved internal wall extending between a top area generally opposite the base of the housing and the process mounting at the base of the housing, the internal wall having a center defined therebetween;

a first access channel having an access channel internal wall disposed on the housing adjacent to the process-mounting in the second compartment and offset relative to the center of the internal wall of the cylindrical housing, the access channel internal wall forming an intersection substantially flush with an inner surface of the second compartment, the access channel connectable to an external piece of electrical conduit containing the cabling;

a circuit in the first compartment compensating the process variable, the circuit providing the compensated process variable to a feedthrough circuit in the bulkhead;

a pair of terminals in the second compartment connected to the feedthrough circuit and to a pair of conductors in the cabling, where the transmitter drains moisture through the channel in a range of mountings;

and wherein the access channel internal wall is substantially flush with and tangent to the curved internal wall of the second compartment, and the access channel internal wall is substantially parallel with the curved internal wall at a point where the access channel internal wall meets a substantially continuous surface therebetween, so as to facilitate drainage of moisture from the second compartment.

2. The transmitter of claim 1 where the first compartment includes a passageway connected to a sensor which senses the process variable, where the passageway and the sensor are disposed in the transmitter housing.

3. The transmitter of claim 2 where the sensor is selected from the group of sensors which sense absolute temperature, differential temperature, differential pressure, absolute pressure, gauge pressure, flow and pH.

4. The transmitter of claim 1 where the circuit in the first compartment includes a receiving means for receiving an externally sensed process variable.

5. The transmitter of claim 1 where a surface of the bulkhead in the second compartment has an integral wall formed thereon so as to separate the bulkhead into a component mounting area and a watershed area, the component mounting area for mounting the terminals and the watershed area concentrating the moisture into the access channel.

6. The transmitter in claim 5 where the access channel blends fully with the inner surface of the second compartment in the watershed area such that when the transmitter is mounted with the access channel oriented downwards, the access channel receives substantially all of the moisture from the watershed area.

7. The transmitter of claim 5 where the bulkhead has an opening in it, and the transmitter further comprises:

a mounting plate having at least one RFI filter disposed thereon; and an encapsulant filling the component mounting area to a top of the integral wall.

8. The transmitter of claim 7 where a circuit card is disposed in the component mounting area and contacts the encapsulant.

9. The transmitter of claim 8 where a bezel is disposed over the circuit card.

10. The transmitter of claim 5 where the terminals are positioned in the component mounting area in the shape of a horseshoe.

11. The transmitter of claim 5 where a pair of joining surfaces in the second compartment are filleted.

12. The transmitter of claim 5 where the watershed area has a smooth surface to facilitate draining of moisture.

13. The transmitter of claim 1 where a second access channel fully intersects the inner surface of the second compartment, the second access channel located substantially opposite the first access channel.

14. The transmitter of claim 13 where a surface of the bulkhead in the second compartment has an integral wall formed thereon so as to separate the bulkhead into a component mounting area and a watershed area, the component mounting area for mounting the terminals and the watershed area concentrating the moisture into one of the access channels.

15. The transmitter in claim 14 where the watershed area also contains a cable guide fixedly disposed on the bulkhead between the first access channel and the second access channel to guide the conductors to the terminals.

16. The transmitter of claim 13 where the first access channel and the second access channel are flared as both channels enter the second compartment so as to increase the range of mountings over which the transmitter functionally drains moisture.

17. The transmitter of claim 16 which drains substantially any moisture accumulated over a 180 degree range of mounting orientations.

* * * * *